(12) United States Patent
Su et al.

(10) Patent No.: US 8,422,223 B2
(45) Date of Patent: Apr. 16, 2013

(54) MULTI-MODULAR DATA CENTER

(75) Inventors: Tsung-Han Su, Taipei Hsien (TW);
Chung-I Lee, Taipei Hsien (TW);
Chun-Ming Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 275 days.

(21) Appl. No.: 12/859,288

(22) Filed: Aug. 19, 2010

(65) Prior Publication Data

US 2012/0006507 A1     Jan. 12, 2012

(30) Foreign Application Priority Data

Jul. 9, 2010   (TW) .................................. 99122651

(51) Int. Cl.
*H05K 7/20*    (2006.01)

(52) U.S. Cl.
USPC ........... 361/690; 361/688; 361/689; 361/694; 361/695

(58) Field of Classification Search .................... None
See application file for complete search history.

(56) References Cited

U.S. PATENT DOCUMENTS

| | | | |
|---|---|---|---|
| 6,950,895 B2* | 9/2005 | Bottom | 710/301 |
| 7,248,942 B2* | 7/2007 | Bash et al. | 700/213 |
| 7,310,737 B2* | 12/2007 | Patel et al. | 713/300 |
| 7,664,968 B2* | 2/2010 | Bahali et al. | 713/300 |
| 7,738,251 B2* | 6/2010 | Clidaras et al. | 361/701 |
| 7,852,627 B2* | 12/2010 | Schmitt et al. | 361/695 |
| 7,885,795 B2* | 2/2011 | Rasmussen et al. | 703/5 |
| 7,961,463 B2* | 6/2011 | Belady et al. | 361/695 |
| 8,047,904 B2* | 11/2011 | Yates et al. | 454/118 |
| 2010/0139887 A1* | 6/2010 | Slessman | 165/67 |

\* cited by examiner

*Primary Examiner* — Boris Chervinsky
(74) *Attorney, Agent, or Firm* — Altis Law Group, Inc.

(57) ABSTRACT

A multi-modular data center includes at least one modular computing module and at least one modular power supply module. The modular computing module includes a transportable container, a plurality of computing systems, a cooling system, a surveillance system, and a network interface. The modular power supply module includes a transportable container and a plurality of power supply systems. The transportable containers are configured for transport via a transport infrastructure. The plurality of computing systems is mounted within the transportable container. The cooling system is disposed in the transportable container. The surveillance system is configured to monitor the transportable container. The network interface is configured to interface between an Internet access connection and the computing systems. The plurality of power supply systems is mounted within the transportable container.

10 Claims, 3 Drawing Sheets

MULTI-MODULAR DATA CENTER

BACKGROUND

1. Technical Field

The present disclosure relates to data centers and, particularly, to a multi-modular data center.

2. Description of Related Art

With increasing heavy duty use of on-line application, the need for computer data centers has increased rapidly. Data centers are centralized computing facilities that include as many as hundreds of thousands of computers, often arranged in computer racks or shelves. Such data centers represent considerable cost, including conventional physical site expenses. Additionally, known architectures for data center systems involve overly involved and complex approaches that increase the cost and latency of such systems. Currently, the building cycle from concept to operation can take a year.

Therefore, a multi-modular data center is desired to overcome the limitations described.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present apparatus for assembling a machine tool. Moreover, in the drawings, like reference numerals designate corresponding parts throughout the several views.

DETAILED DESCRIPTION

Figure 1:
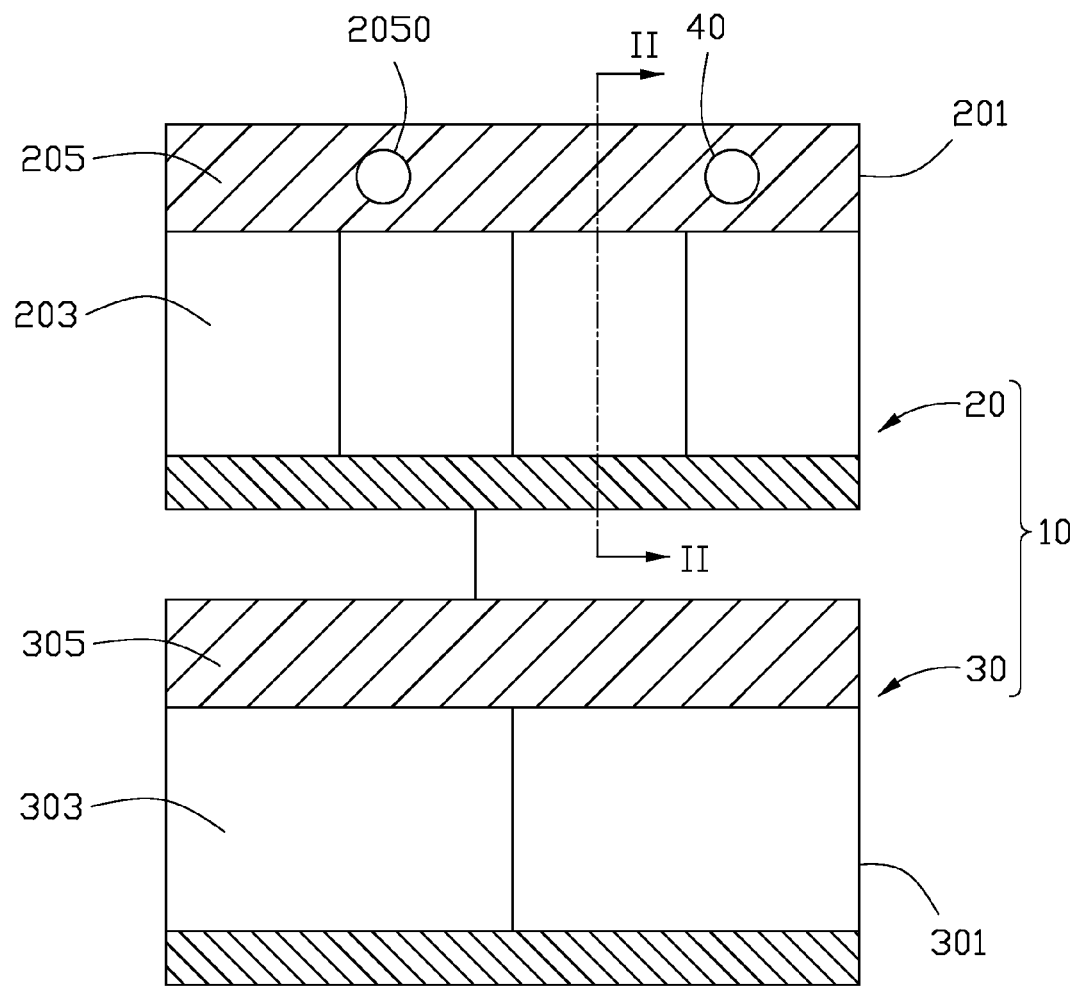
FIG. 1 is a schematic diagram of a multi-modular data center according to an exemplary embodiment.

FIG. 1 is a schematic diagram of an illustrative embodiment of a multi-modular data center 10. The multi-modular data center 10 includes at least one modular computing module 20 and at least one modular power supply module 30.

The modular computing module 20 includes a transportable container 201, a plurality of computing systems 203, and a cooling system 205. The modular computing module 20 with multiple computing systems 203 is contained in the transportable container 201. The transportable container 201 allows transport via a transport infrastructure. The cooling system 205 is disposed in the transportable container 201 for evacuating heat from inside the container to the exterior. The cooling system 205 includes a temperature control system 2050 for maintaining a predetermined air temperature surrounding the computing systems 203. The computing module 20 further includes a network interface (not shown) to interface between an Internet access connection and the computing systems 203.

The modular power supply module 30 includes a transportable container 301, a plurality of power supply systems 303, and a cooling system 305. The modular power supply module 30 interconnects the modular computing module 20 for supplying power to the modular computing module 20. The transportable container 301 allows transport via a transport infrastructure. The power supply systems 303 include a plurality of power distribution units (PDUs) and a plurality of uninterruptible power supply systems (UPSs) for distributing power from a central power source to the modular computing module 20. The cooling system 305 is disposed in the transportable container 301 for transferring heat from inside the container to the exterior. The cooling system 305 may include a temperature control system (not shown) for maintaining a predetermined air temperature surrounding the power supply systems 303. The modular power supply module 30 further includes a network interface (not shown) to interface between an Internet access connection and the power supply systems 303.

Figure 2:
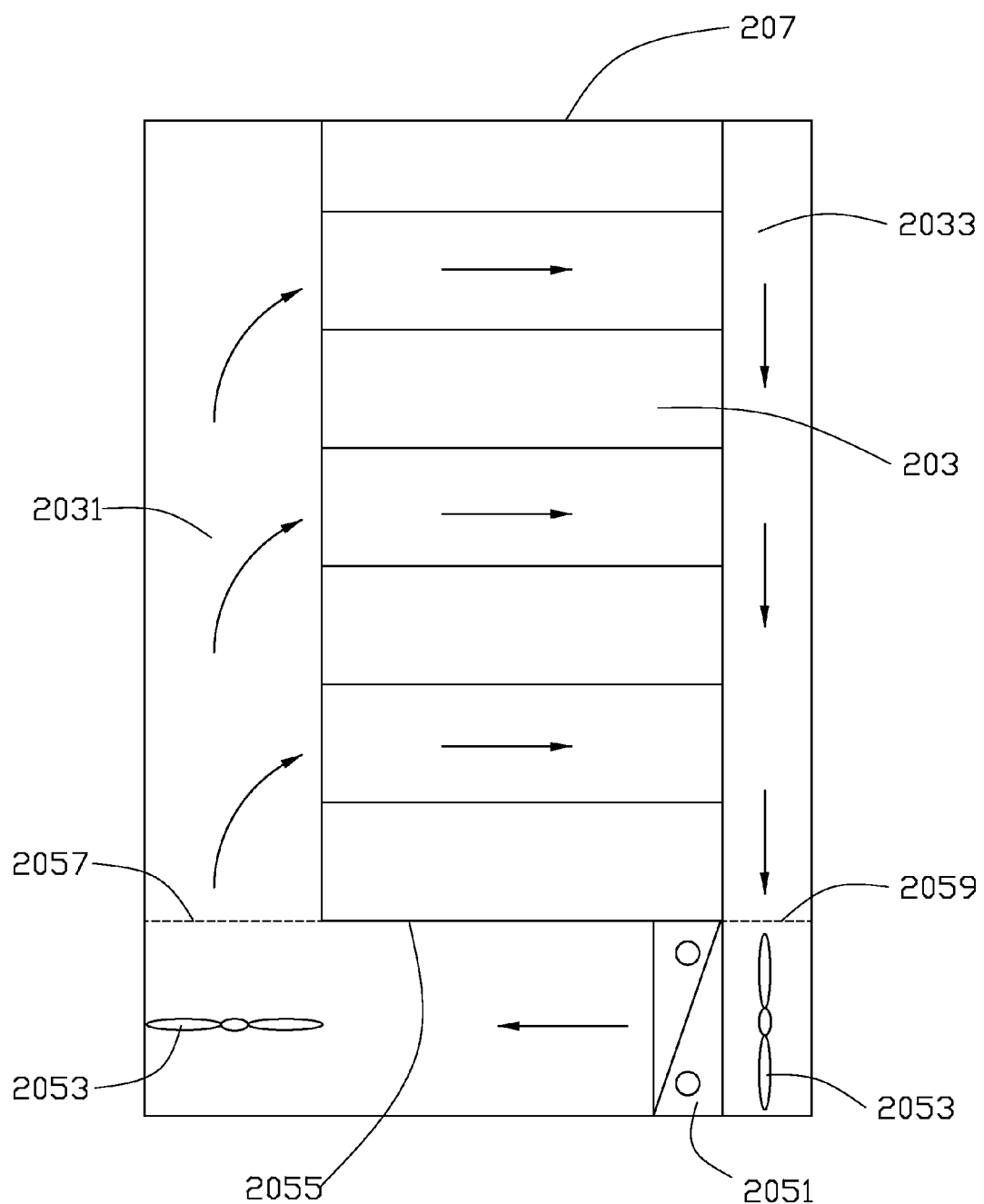
FIG. 2 is a cross-section of the multi-modular data center of FIG. 1, taken along line II-II thereof.

FIG. 2 is a cross-section of the multi-modular data center 10 of FIG. 1, taken along line II-II thereof. The computing systems 203 are mounted within mounting structures, wherein the mounting structures include rack mounting structures or shelf mounting structures 207. Each modular computing module 20 may implement a built-in refrigerated cooling system to remove heat generated by the computing systems 203. For example, each rack mounting structures or shelf mounting structures 207 has a dedicated enclosed environment, allowing finer temperature and/or humidity control via a temperature control system corresponding to the rack mounting structures or shelf mounting structures 207. A front plenum 2031 is formed on the front of the computing systems 203. A rear plenum 2033 is formed on the back of the computing systems 203. The front and rear plenums 2031, 2033 communicate via spaces between the computing systems 203 and facilitate air circulation for purposes of cooling the computing systems 203 of the rack mounting structures or shelf mounting structures 207, for example.

In particular, the cooling system 205 for each computing systems 203 may generally include an evaporator coil 2051 and a plurality of fans 2053 to impel warm airflow over the evaporator coil 2051 for cooling. The evaporator coil 2051 and the plurality of fans 2053 are disposed below a raised floor 2055 of the modular computing module 20. The evaporator coil 2051 may be in fluid communication with the condenser output and a compressor suction line, for example. The plurality of fans 2053 may impel cool air into the front plenum 2031 through a front grill 2057 of the raised floor 2055, over the computing systems 203 to cool the computing systems 203 and draw warm air through the rear plenum 2033 and a rear grill 2059 of the raised floor 2055.

Figure 3:
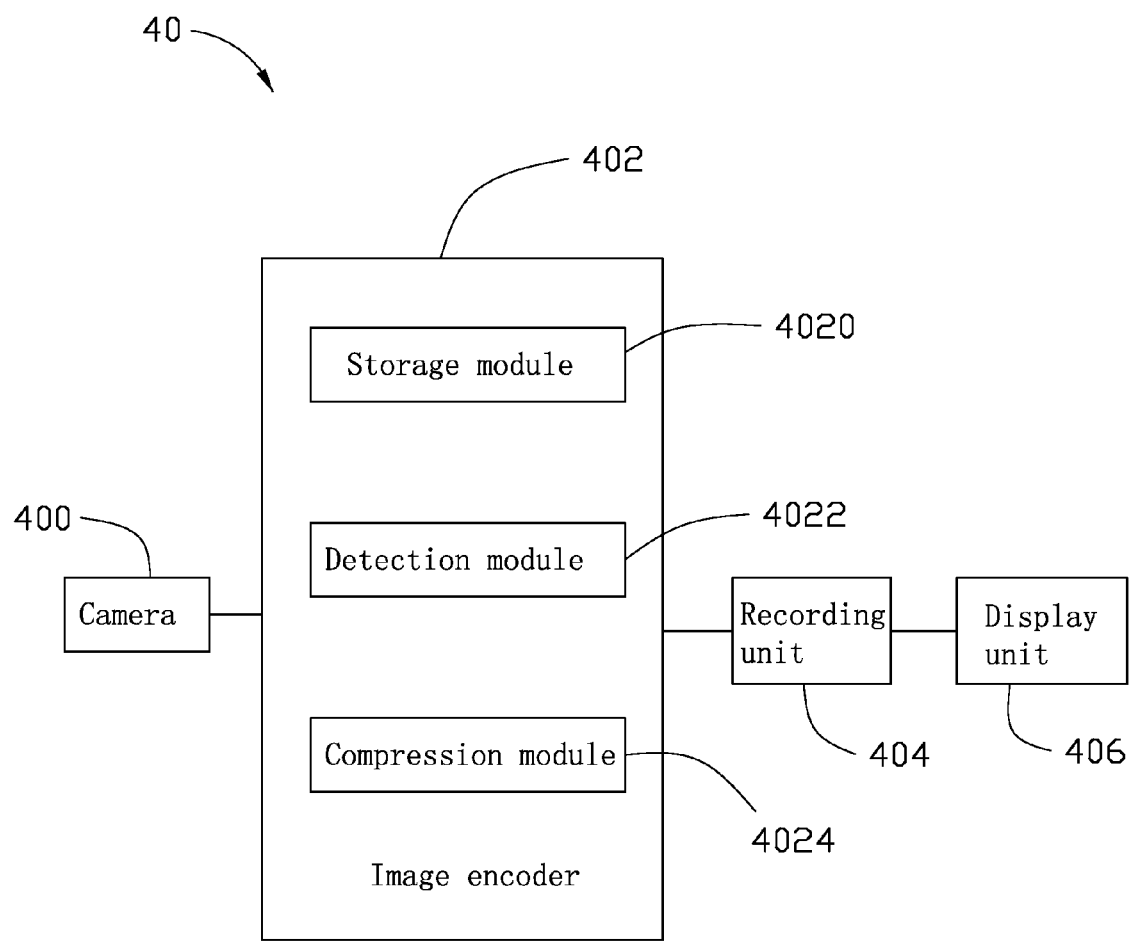
FIG. 3 is a schematic block diagram of a surveillance system of the multi-modular data center as disclosed.

The modular computing module 20 provides a surveillance system 40 for monitoring the transportable container 201. Referring to FIG. 3, the surveillance system 40 includes a camera 400, an image encoder 402, a recording unit 404, and a display unit 406. The image encoder 402 includes a storage module 4020, a detection module 4022, and a compression module 4024. A plurality of images of a surveillance subject captured by the camera 40 is transmitted to the storage module 4020 of the image encoder 402. The detection module 4022 examines the plurality of images stored in the storage module 4020 to acquire key portions of each image, and coordinates of the acquired key portions. For example, if the surveillance subject is a service technician, and the key portion of the service technician is a face, for identification purposes, coordinates of the key portions of the images are transmitted to the compression module 4024 of the image encoder 402. It can be understood that the detection module 4022 acquires key portions of each image with known technology. The compression module 4024 compresses data of the portions of each image other than the key portions. In other words, the compression module 4024 compresses data of portions of each image other than those with the coordinates from the detection module 4022. The compression module 4024 transmits the data of the key portions and the other portions of each image to the recording unit 404. The recording unit 404 records the data. The display unit 406 displays the recorded video from the recording unit 404. In the embodiment, the recording unit 404 is a videocassette recorder (VCR), the display unit 406 is a monitor, and the storage module 4020 is a hard disk. The modular power supply module 30 also provides a surveillance system (not shown) for monitoring the transportable container 301.

The modular computing module 20 and the modular power supply module 30 may also provide sensors (not shown) to detect motion in the modular computing module 20 and the modular power supply module 30. The sensors may for example be vibration sensors, airflow sensors, moisture sensors, threshold sensors, smoke detectors, or forced entry detectors.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-modular data center, comprising:
   at least one modular computing module, each comprising:
   a first transportable container configured for transport via a transport infrastructure; and
   a plurality of computing systems mounted within the first transportable container and configured to be shipped and operated within the first transportable container;
   a cooling system disposed in the first transportable container for transferring heat from inside the container to the exterior;
   a surveillance system for monitoring the first transportable container; and
   a network interface configured to interface between an Internet access connection and the computing systems; and
   at least one modular power supply module, each comprising:
   a second transportable container configured for transport via a transport infrastructure; and
   a plurality of power supply systems mounted within the second transportable container and configured for generating power for the at least one modular computing module;
   wherein the surveillance system includes a camera, an image encoder and a recording unit, and wherein the camera captures a plurality of images of a surveillance subject, and the image encoder includes a storage module, a detection module and a compression module, and wherein the recording unit records the plurality of images from the compression module.

2. The multi-modular data center of claim 1, wherein the storage module stores the plurality of images of the surveillance subject from the camera, the detection module examines the plurality of images stored in the storage module to determine key portions of each image; and the compression module compresses data of the portions of each image other than the key portions.

3. The multi-modular data center of claim 1, wherein the modular power supply module further includes a surveillance system for monitoring the second transportable container.

4. The multi-modular data center of claim 3, wherein the surveillance system includes a camera, an image encoder and a recording unit, and wherein the camera captures a plurality of images of a surveillance subject, the image encoder includes a storage module, a detection module and a compression module, and the recording unit records the plurality of images from the compression module.

5. The multi-modular data center of claim 4, wherein the storage module stores the plurality of images of the surveillance subject from the camera, the detection module examines the plurality of images stored in the storage module to determine key portions of each image; and wherein the compression module compresses data of the portions of each image other than the key portions.

6. The multi-modular data center of claim 1, wherein each of said at least one modular power supply module further comprises a cooling system disposed in the second transportable container for transferring heat from inside the container to the exterior.

7. The multi-modular data center of claim 6, wherein the storage module stores the plurality of images of the surveillance subject from the camera, and wherein the detection module examines the plurality of images stored in the storage module to determine key portions of each image; and wherein the compression module compresses data of the portions of each image other than the key portions.

8. The multi-modular data center of claim 6, wherein the modular power supply module further includes a surveillance system for monitoring the second transportable container.

9. The multi-modular data center of claim 8, wherein the surveillance system includes a camera, an image encoder and a recording unit, and wherein the camera captures a plurality of images of a surveillance subject, and wherein the image encoder includes a storage module, a detection module and a compression module, and wherein the recording unit records the plurality of images from the compression module.

10. The multi-modular data center of claim 9, wherein the storage module stores the plurality of images of the surveillance subject from the camera, and wherein the detection module examines the plurality of images stored in the storage module to determine key portions of each image; and wherein the compression module compresses data of the portions of each image other than the key portions.

* * * * *